United States Patent [19]

Abramson et al.

[11] Patent Number: 5,635,862

[45] Date of Patent: Jun. 3, 1997

[54] HIGH-SPEED BLOCK ID ENCODER CIRCUIT USING DYNAMIC LOGIC

[75] Inventors: Jeffrey M. Abramson, Aloha; Bryon G. Conley, Hillsboro; Borislav Agapiev, Portland, all of Oreg.

[73] Assignee: Intel Corporation, Santa Clara, Calif.

[21] Appl. No.: 580,656

[22] Filed: Dec. 29, 1995

[51] Int. Cl.$^6$ .............................................. H03K 14/0175
[52] U.S. Cl. ............................ 326/105; 326/62; 326/93
[58] Field of Search ........................ 326/21, 62, 59–60, 326/105, 93; 341/102

[56] References Cited

U.S. PATENT DOCUMENTS

| | | | |
|---|---|---|---|
| 4,202,044 | 5/1980 | Beilstein, Jr. et al. | 326/60 X |
| 4,631,428 | 12/1986 | Grimes | 326/59 |
| 5,557,275 | 9/1996 | Van Valburg et al. | 341/160 |

OTHER PUBLICATIONS

Popescu, Val, Merle Schultz, John Spracklen, Gary Gibson, Bruce Lightner and David Isaman, "The Metaflow Architecture", IEEE Micro, Jun. 1991, pp. 10–13 and 63–73.

*Primary Examiner*—David R. Hudspeth
*Attorney, Agent, or Firm*—Blakely, Sokoloff, Taylor & Zafman

[57] ABSTRACT

A high-speed block id encoder circuit using dynamic logic includes a plurality of input signal lines received from a memory array and a plurality of output signal lines. A first portion of the encoder circuit pre-charges the plurality of output signal lines to a first state. A plurality of transistors coupled together in a single level receives the input signals and discharges the appropriate output signal lines to a second state based on the input signals. The signals produced on the output lines provide an encoded output identifying which one of the plurality of input signal lines is asserted.

14 Claims, 6 Drawing Sheets it # 5,635,862

HIGH-SPEED BLOCK ID ENCODER CIRCUIT USING DYNAMIC LOGIC

BACKGROUND OF THE INVENTION

1. Field of the Invention

The present invention pertains to the field of digital circuitry. More particularly, this invention relates to block id encoder circuitry.

2. Background

As the computer revolution has progressed the quest of microprocessor developers has been to develop chips exhibiting more power and faster performance. Substantial effort has been focused on increasing transistor populations on single microprocessor integrated circuits. That effort continues with today's microprocessors now housing literally millions of transistors on a single chip. Further integration has allowed processor clock speeds to be greatly increased with the increased density of transistors.

Given their increased power and performance, modern microprocessors have found uses in a wide range of fields. Many of the electronic goods which are commercially available today and the majority of control systems used in manufacturing and industry include one or more microprocessors.

Given the large number of transistors involved, modern microprocessors are divided into discrete functional blocks through which instructions are propagated one stage at a time. As the number of transistors on a single chip has increased, effort has been expended to reduce the number of transistors used within these functional blocks. Reducing the number of transistors required to carry out the function of a particular functional block frees up space which can be used to incorporate additional capabilities in the chip.

An additional concern in microprocessor design has been to increase the overall speed of the microprocessor. This is accomplished by increasing the speed at which each of the functional blocks, as well as the logic devices within the functional blocks, operates.

One such logic device which is often utilized in microprocessors, as well as other electronic devices, is an encoder. A typical encoder is a device which encodes onto n binary output signals which one of up to $2^n$ binary input signals is asserted. Encoders can be very useful in many areas because they can reduce the number of signals which have to be transported within the chip and, possibly, stored. For example, eight input signals can be encoded onto three output signals, thereby reducing the number of signals which need to be transported to other areas of the chip by five, and if the value needs to be stored, then reducing the number of bit storage elements required by five.

One method of building encoders which has been used in microprocessors is a multiple-level combinatorial logic approach. This approach includes combining multiple inverters, logical NAND gates, and logical NOR gates. This approach, however, typically involves passing the input signals through several levels of gates, thereby reducing the speed of the encoder. Thus, it would be beneficial to design an encoder with a reduced number of levels of gates through which signals propagate.

Additionally, many transistors are typically used to build an encoder using a multiple-level combinatorial logic approach, thereby taking valuable chip area away from other components which may need the area. Thus, it would be beneficial to design an encoder with a reduced number of transistors.

One additional logic device used in many electronic devices, including microprocessors, is a memory array or similar structure. Memory arrays have a wide variety of uses, such as storing multiple data entries. When using memory arrays, it is often desirable to identify which one of the multiple entries matches a particular input. Thus, it would be beneficial to provide a circuit which quickly identifies, using a reduced number of transistors, which one of multiple memory array entries matches a particular input.

As will be described in more detail below, the present invention provides for a circuit that achieves these and other desired results which will be apparent to those skilled in the art from the description to follow.

SUMMARY OF THE INVENTION

A high-speed block id encoder circuit using dynamic logic is disclosed herein. The circuit includes a plurality of input signal lines received from an array and a plurality of output signal lines. A first portion of the encoder circuit pre-charges the plurality of output signal lines to a first state. A plurality of transistors coupled together in a single level receives the input signals and discharges the appropriate output signal lines to a second state based on the input signals. The signals produced on the output lines provide an encoded output identifying which one of the plurality of input signal lines is asserted.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
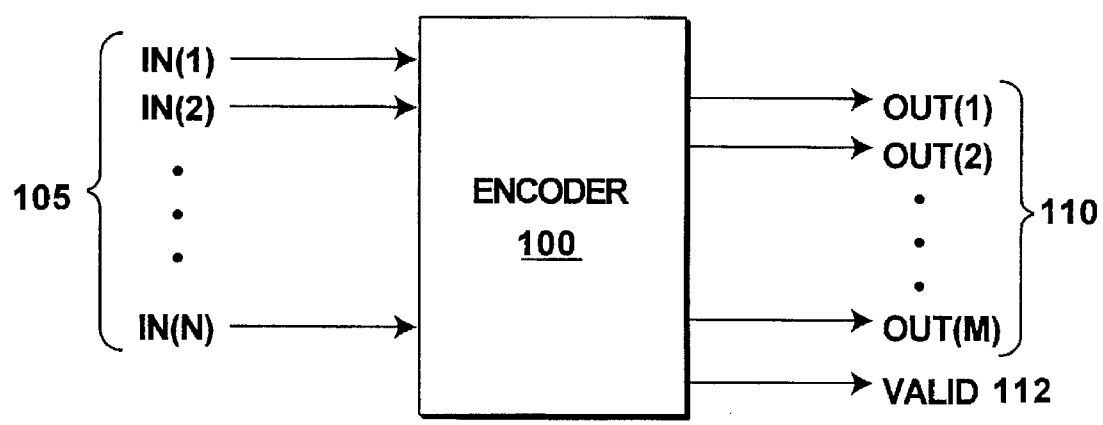
FIG. 1 is a block diagram showing an encoder according to one embodiment of the present invention.

In the following detailed description numerous specific details are set forth in order to provide a thorough understanding of the present invention. However, it will be understood by those skilled in the art that the present invention may be practiced without these specific details. In other instances, well known methods, procedures, components, and circuits have not been described in detail so as not to obscure aspects of the present invention. It should be noted that the present invention can be practiced in a variety of manners, such as by fabrication by silicon or gallium arsenide or other processes.

In the descriptions which follow reference is made to logical zeroes and logical ones. A logical zero typically represents a voltage of between 0.0 and 0.5 volts. When a particular signal or node is a logical zero, the signal or node is referred to as being low or in a low state. A logical one typically represents a voltage of between 1.8 and 5.5 volts. When a particular signal or node is a logical one, the signal or node is referred to as being high or in a high state. It is to be appreciated, however, that the voltages which represent a logical zero or a logical one can be different than the ranges mentioned above.

Metal-oxide semiconductor (MOS) transistors are also discussed in the descriptions which follow. A MOS transistor is an electronic component which typically comprises two terminals (commonly referred to as source and drain) and a gate terminal. Two general types of transistors are typically used: p-channel transistors and n-channel transistors. In an n-channel transistor, current flows between the two terminals when greater than a threshold voltage is applied to the gate terminal (that is, the transistor is turned on). Generally, the greater the voltage, the greater the current flow between the terminals. If the voltage applied to the gate terminal is less than the threshold voltage, then current does not flow between the two terminals (that is, the transistor is turned off). Similarly, in a p-channel transistor, current does not flow between the two terminals when greater than a threshold voltage is applied to the gate terminal (that is, the transistor is turned off). Otherwise, current does flow between the two terminals (that is, the transistor is turned on). Generally, the lower the voltage, the greater the current flow between the terminals. Transistors are well-known to those skilled in the art and thus will not be described further.

MOS transistors are typically field effect transistors (FETs) which are either p-channel or n-channel devices. PMOS technology refers to transistors having only p-channel devices. NMOS technology refers to transistors having only n-channel devices. CMOS technology refers to transistors which use both p-channel and n-channel devices.

The circuit of the present invention provides a high-speed encoder with a reduced transistor count. According to the present invention, the encoder is precharged to a first state. After pre-charging, the input signals to the encoder can be asserted, causing the outputs to either maintain the first state or transition to a second state. Whether the outputs maintain the first state or transition to the second state is dependent on whether connections exist between the output lines and a set of transistors. If a connection exists, then the output line transitions to the second state; otherwise, the output line maintains the first state. Whether a connection between a particular output line and a transistor is available is dependent on the particular encoding being used.

FIG. 1 is a block diagram showing an encoder according to one embodiment of the present invention. An encoder 100 is shown having N input signal lines 105 and M output signal lines 110. The encoder 100 also has a valid signal output line 112 for indicating to other logic devices that the output signals are valid.

In one embodiment of the present invention, encoder 100 is a 12-to-4 encoder. That is, one of the twelve input signal lines 105 can be active, and an identification of the one active input signal line is encoded in a binary format onto four output signal lines 110. In this embodiment, whenever one of the input signal lines 105 is asserted, the valid signal 112 is asserted by encoder 100, thereby identifying that the signals on output lines 110 are valid. An example encoding of encoder 100 having twelve input signal lines and four output signal lines is shown in Table I.

TABLE I

| Active Signal Line | Output Line 1 | Output Line 2 | Output Line 3 | Output Line 4 |
|---|---|---|---|---|
| Input Line 1 | 0 | 0 | 0 | 0 |
| Input Line 2 | 0 | 0 | 0 | 1 |
| Input Line 3 | 0 | 0 | 1 | 0 |
| Input Line 4 | 0 | 0 | 1 | 1 |
| Input Line 5 | 0 | 1 | 0 | 0 |
| Input Line 6 | 0 | 1 | 0 | 1 |
| Input Line 7 | 0 | 1 | 1 | 0 |
| Input Line 8 | 0 | 1 | 1 | 1 |
| Input Line 9 | 1 | 0 | 0 | 0 |
| Input Line 10 | 1 | 0 | 0 | 1 |
| Input Line 11 | 1 | 0 | 1 | 0 |
| Input Line 12 | 1 | 0 | 1 | 1 |

It is to be appreciated that encoder 100 may have any number N inputs and any number M outputs. In one embodiment, the relationship between inputs and outputs of encoder 100 is the following: up to $2^n$ inputs can be encoded onto n binary outputs.

In an alternate embodiment of the present invention, the encoding of Table I is inverted. Thus, for example, in this alternate embodiment, if input line 6 were asserted, then the encoded output on output lines 1–4 would be "1010" rather than "0101".

Figure 2:
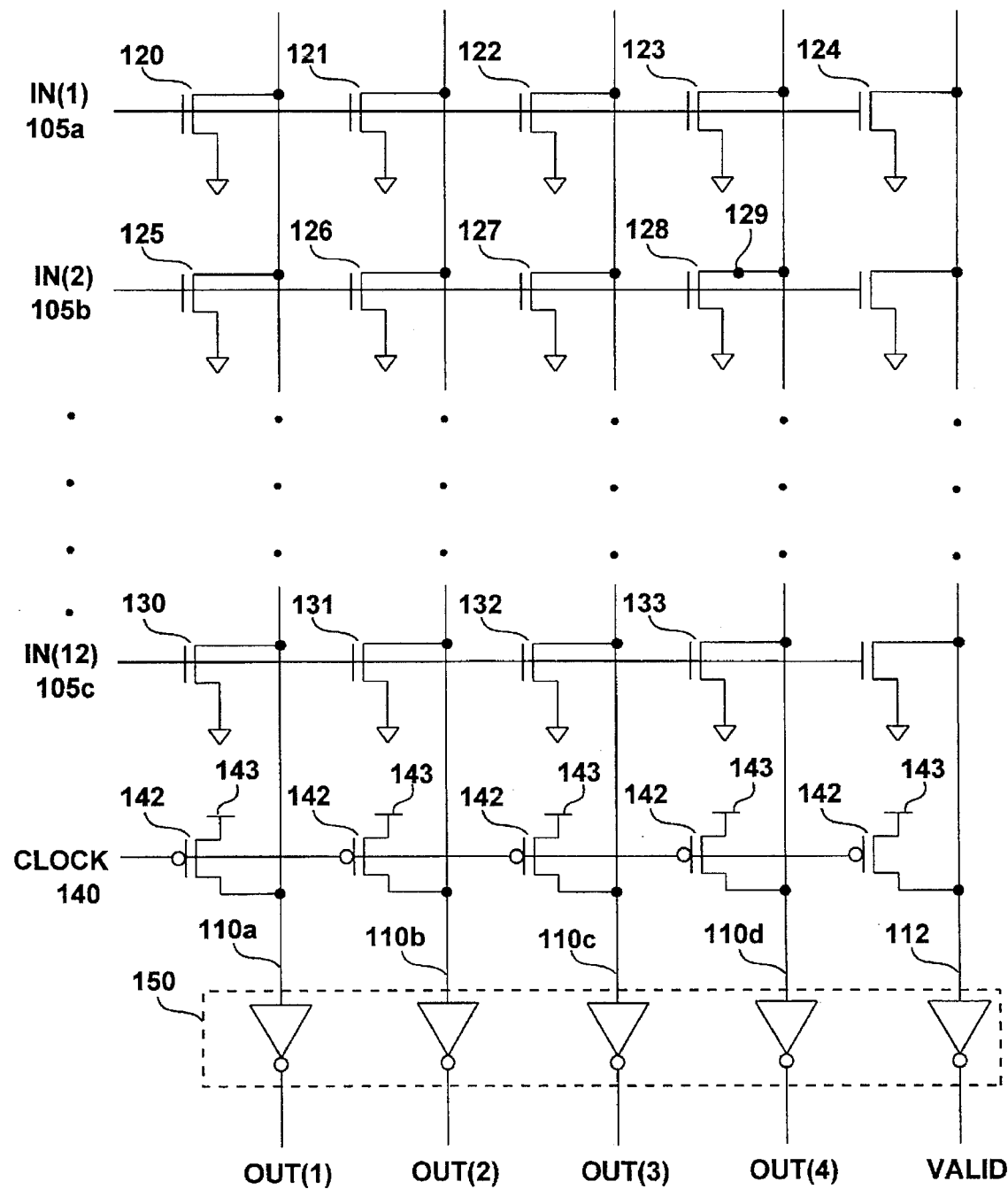
FIG. 2 is a schematic drawing showing the circuitry of an encoder according to one embodiment of the present invention.

FIG. 2 is a schematic drawing showing the circuitry of an encoder according to one embodiment of the present invention. Encoder 200 includes twelve input signal lines, however, only three of the twelve input lines are shown (signal lines 105a, 105b, and 105c) to avoid cluttering the drawing. In one embodiment, the transistors of FIG. 2 are n-channel and p-channel MOSFETs as shown.

As shown in FIG. 2, each of the inputs 105a–105c is input to a row of five different transistors. Four of the five transistors correspond to the four different output signal lines 110a, 110b, 110c, and 110d, as shown. The fifth transistor corresponds to the valid output line 112. The transistors are coupled to the input lines 105 and the output lines 110 as shown. For example, input signal line 105a is input to the gate terminals of transistors 120, 121, 122, 123, and 124. One terminal of each transistor 120, 121, 122 and 123 is coupled to output signal line 110a, 110b, 110c, and 110d, respectively, and the second terminal is coupled to ground. One terminal of transistor 124 is coupled to valid output line 112 and the second terminal is coupled to ground.

Encoder 200 can be used to encode the signals on input lines 105 onto the output lines 110 using the encoding shown above in Table I. In one embodiment, the encoding of Table I indicates whether a particular transistor should be coupled to its corresponding output signal line 110a–110d, or whether the connection should be cut. In one implementation, if the output signal should be a logical zero, then the connection is maintained. However, if the output signal should be a logical one, then the connection is severed. Cutting or severing of the connection refers to the physical transmission line (e.g., the metal line connection) being cut, thereby preventing current from flowing between the transistor and the corresponding output signal line.

By way of example, the encoding of Table I indicates that if signal IN(1) (e.g., corresponding to input line 105a) is asserted, then each of the output signal lines 110a–110d should be a logical zero. Thus, the connection between each of the transistors 120, 121, 122 and 123 and its corresponding output line 110a, 110b, 110c or 110d is maintained. By way of another example, if signal In(2) (e.g., corresponding to input line 105b) is asserted, then each of the output signal lines 110a–110c should be a logical zero and the output signal line 110d should be a logical one. Thus, the connection between each of the transistors 125, 126 and 127 and its corresponding output line 110a, 110b and 110c is maintained. However, the connection between transistor 128 and output signal line 110d is cut, such as at location 129.

By way of yet another example, if signal IN(12) (e.g., corresponding to input line 105c) is asserted, then the output signal line 110b should be a logical zero and each of the output signals 110a, 110c, and 110d should be a logical one. Thus, the connections between each of the transistors 130, 132 and 133 and their corresponding output lines 110a, 110c and 110d are cut. However, the connection between transistor 131 and output signal line 110b is maintained.

The circuitry of encoder 200 is referred to as "domino logic" or "dynamic logic". Domino (or dynamic) logic refers to the output line(s) being pre-charged to a first state and being allowed to float at that first state. Then, when the input signal to the encoder is asserted, the appropriate output line(s), if any, are able to quickly transition to a second state. Thus, encoder 200 can be viewed as having two portions: a first portion which pre-charges the output signal lines and a second portion which causes the output signal lines to be discharged.

The encoder 200 operates in the following manner to output the proper encoding based on an input clock signal line 140 and the input lines 105. The encoder 200 is "pre-charged" to a first state when the clock signal line 140 is low. In one implementation, this pre-charged first state corresponds to a logical one. As shown in FIG. 2, multiple p-channel transistors 142 are coupled to clock signal line 140 and the output signal lines 110. The gate terminal of each transistor 142 is coupled to the clock signal line 140. Each transistor 142 is also coupled to a voltage source 143 and to one of the output signal lines 110a–110d as shown. Thus, when the clock signal 140 is low, transistors 142 allow the voltage source 143 to pre-charge each of the output signal lines 110a–110d to a high state.

After encoder 200 is pre-charged, one of the input signal lines 105 is asserted. Which one of the input signal lines is asserted is dependent on the logic device whose outputs are being encoded. Each input signal line 105 is coupled to the gate terminal of its corresponding transistors. When the signal line 105 is asserted, it causes the n-channel transistors to turn on, thus creating a current flow from the pre-charged output signal line to a ground and thereby causing the output signal line to transition to a low state. If the connection from the transistor to the output signal line has been cut, then the output signal line remains in a high state. Thus, the encoding from Table I is output by encoder 200.

As shown in FIG. 2, the signals from input lines 105 pass through a single level of transistors prior to being output on output lines 110. Additionally, the output lines are pre-charged to a high state, thereby allowing them to be quickly discharged in response to a signal on one of the input lines 105, as discussed above. Thus, the signals on output lines 110 are available quickly after the signals are received on input lines 105. In one embodiment, the signals on output lines 110 are available approximately 300 picoseconds after the signals are received on input lines 105.

In one embodiment of the present invention, the signals from output lines 110a–110d are input to inverters 150 prior to being output by encoder 200. It is to be appreciated that any of a wide variety of conventional buffers (either inverting or non-inverting) could be used in place of inverters 150.

The operation of encoder 200 can be shown, by way of example, by assuming that signal IN(12) from Table I (e.g., corresponding to input signal line 105c) is asserted. Each of the output signal lines 110a–110d is pre-charged to a high state (prior to assertion of input signal line 105c) as discussed above. When input signal line 105c is asserted, each of the transistors 130, 131, 132 and 133 turns on. However, since the connections between the output signal lines and transistors 130, 132 and 133 have been cut, only output signal line 110b is pulled to a low state. Thus, the output signal lines 110a, 110c and 110d will be in a high state, whereas the output signal 110b will be in a low state. Therefore, the output signal lines 110a–110d provide the encoded output from Table I (e.g., "1011" for signal IN(12)).

In one embodiment, the circuitry of encoder 200 is Type II domino logic. Domino logic refers to one or more transistors in parallel with a clocked transistor, as shown in FIG. 2 (e.g., transistors 120, 125 and 142). In Type II domino logic as shown in FIG. 2, no additional transistor is in series with each of the n-channel transistors to prevent an input signal 105 from prematurely providing a connection between the ground and an output line 110. Thus, in the Type II domino logic circuit of FIG. 2, care should be taken to prevent both the clock signal 140 and the input signal lines 105 turning on their respective transistors at the same time. This situation could result in contention for the output line and can provide for unpredictable results. By ensuring that both clock signal 140 and input signal lines 105 cannot turn on their respective transistors at the same time, the circuitry of encoder 200 allows the output lines to be precharged and discharged, as discussed above, providing predictable results.

This surety can be provided in any of a wide variety of conventional manners. For example, the input signal lines 105 can be logically AND'd together with the clock signal line 140 prior to being input to encoder 200.

In one embodiment of the present invention, each of the input signal lines 105 is also coupled to the gate terminal of a transistor coupled to valid signal line 112 as shown. Valid signal line 112 is pre-charged to a high state in the same manner as the output signal lines 110a–110d discussed above. In addition, the connections between the transistors corresponding to the input signal lines 105 and the valid signal line 112 are not cut. Thus, when one of the input signal lines 105 is asserted the output of the valid signal line 112 is in a low state. In this implementation, a low state indicates a valid output. In an alternate implementation, the valid signal line 112 is output through an inverter 150, thereby allowing a high state to indicate a valid output.

In an alternate embodiment of the present invention, the valid signal is generated external to the encoder 200 of FIG. 2. Thus, the valid output signal line 112 is generated by external logic rather than the encoder 200. This valid signal could be generated, for example, using a conventional latch or flip-flop device which receives inputs from the same source as encoder 200 receives the input signal lines 105.

As discussed above, the connections between the transistors and output signal lines 110 can be cut. This cutting is performed during the fabrication process, where previously placed connection lines can be severed. In an alternate embodiment, rather than severing previously laid connections, the connections between the transistors and the output signal lines are not made at all during the fabrication process. In another alternate embodiment, rather than cutting transistors, transistors whose connections are indicated as being cut above are not included in the chip during the fabrication process. In yet another alternate embodiment, the connections between the transistors and output signal lines 110 can include fusible links which can be blown after the fabrication process.

Figure 3:
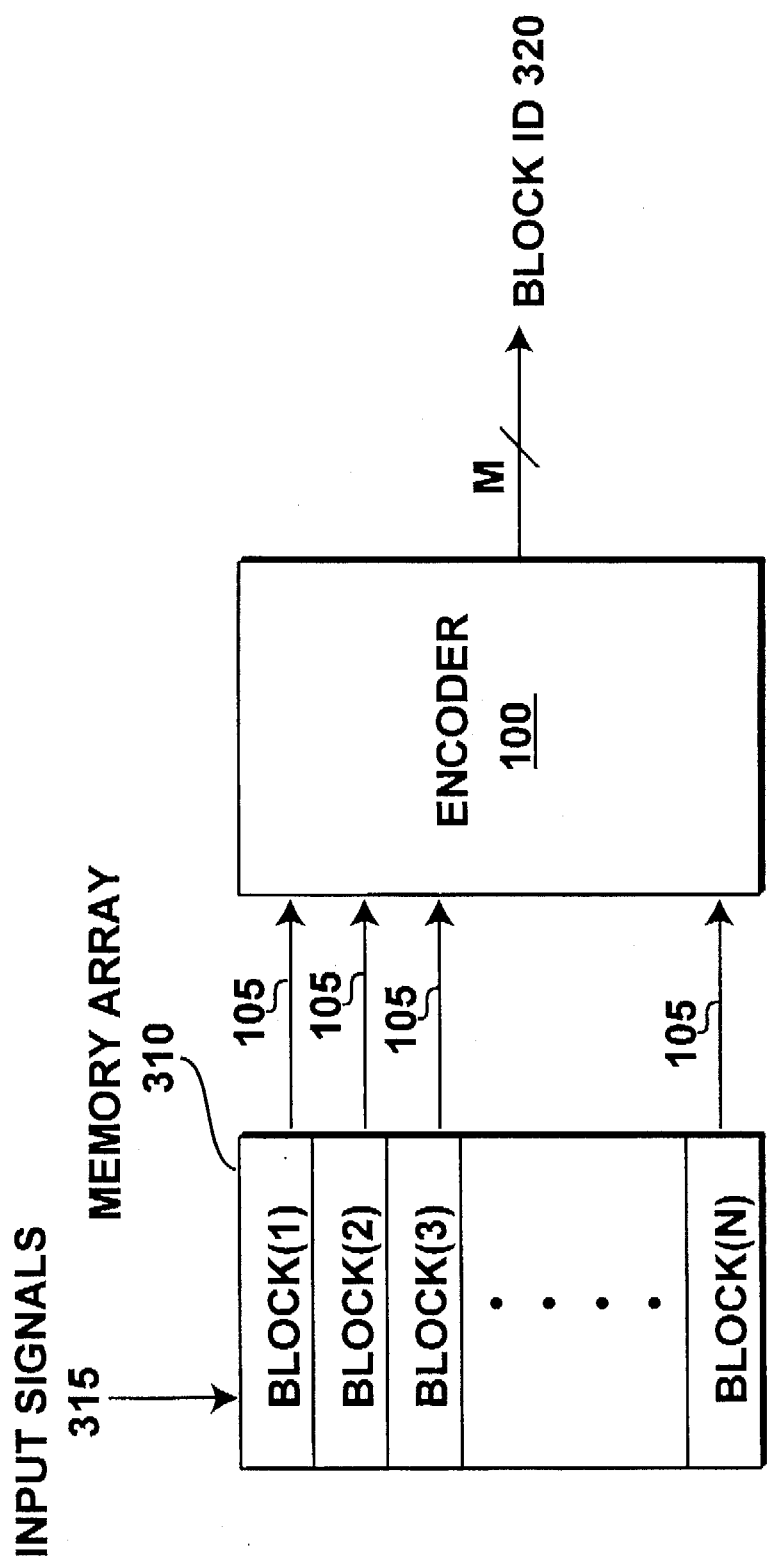
FIG. 3 is a block diagram showing encoding of a memory array output according to one embodiment of the present invention.

FIG. 3 is a block diagram showing encoding of a memory array output according to one embodiment of the present invention. A memory array 310 is shown having N entries, also referred to as blocks. In one embodiment, memory array 310 has a total of twelve entries.

Each entry of memory array 310 can output a signal to encoder 100. In one embodiment, memory array 310 receives input signals 315 corresponding to information stored in array 310. Each entry of memory array 310 individually determines whether it matches the input signals 315. The entry of memory array 310 which matches the input signals 315 outputs a signal to encoder 100. In one embodiment, only a single entry of memory array 310 matches a set of input signals 315, thus only one entry of memory array 310 outputs a signal to encoder 100.

The input signals to encoder 100 cause certain output signal lines to discharge, as described above with reference to FIG. 2. Thus, when a clock signal is provided to encoder 100, the output of encoder 100 is provided as a block id 320 of the memory array 310 entry which output the signal 105 to encoder 100.

Memory array 310 represents a wide variety of conventional memory arrays which can be used in any of a wide variety of manners. For example, memory array 310 may store addresses corresponding to memory locations which are being retrieved from a RAM storage device. By way of another example, each entry of memory array 310 may represent an output from a different functional block of a carry lookahead adder.

Thus, the present invention provides an encoded identifier of which entry of a memory array matches a given set of input signals. The resultant identifier is generated quickly due in part to the reduced number of transistors used by the encoder circuit, as described above. Furthermore, as described above, the chip area required to provide the encoded identifier is reduced, again due in part to the reduced number of transistors used by the encoder circuit.

Figure 4:
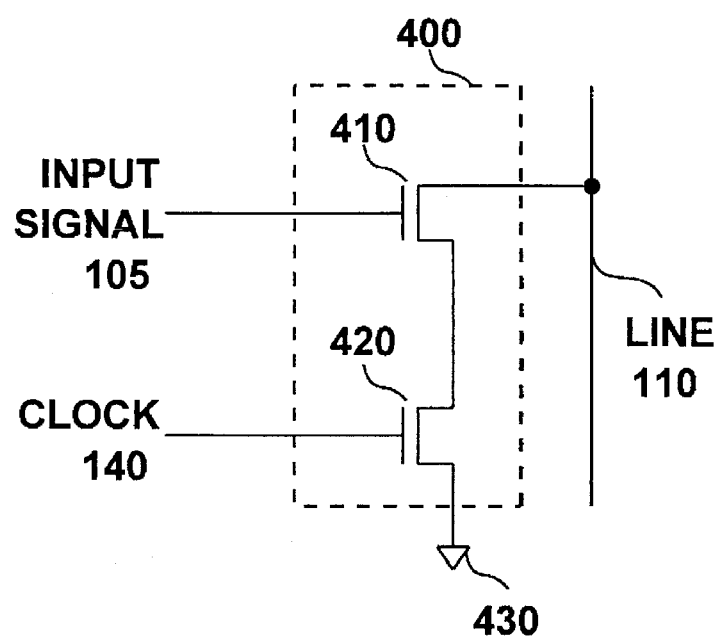
FIG. 4 shows an example dual-transistor circuit which can be used in an encoder according to one embodiment of the present invention.

In an alternate embodiment, the present invention uses Type I domino logic. FIG. 4 shows an example dual-transistor circuit which can replace the single n-channel transistors of FIG. 2 according to one embodiment of the present invention. Each of the n-channel transistors in FIG. 2 could be replaced by circuit 400. For example, each of the transistors 120, 121, 122, 123 and 124 of FIG. 2 can be replaced with the dual-transistor circuit 400 of FIG. 4.

Dual-transistor circuit 400 includes a first n-channel transistor 410 and a second n-channel transistor 420, coupled together as shown. The gate terminal of transistor 410 is coupled to an input signal line 105. The gate terminal of the transistor 420 is coupled to the clock signal line 140.

As discussed above, when the clock signal 140 is tow, the output lines 110 of encoder 200 are pre-charged. If an input signal line 105 of FIG. 2 were to transition high prior to clock signal 140 transitioning high, then the output signal line(s) 110 could prematurely discharge. However, in the circuitry of FIG. 4, transistor 420 prevents such premature discharge. The clock signal being low causes transistor 420 to be turned off. Thus, regardless of the value of the signal on input line 105, the line 110 does not discharge until the clock signal 140 transitions high, thereby turning on the transistor 420 and providing a connection between the ground 430 and transistor 410.

The Type I domino logic shown in FIG. 4 allows the output line to be pre-charged to the first state without fear of an erroneous signal on input signal line 105 causing the premature discharge of output line 110. Thus, timing constraints for the signals on input signal line 105 are reduced.

Figure 5:
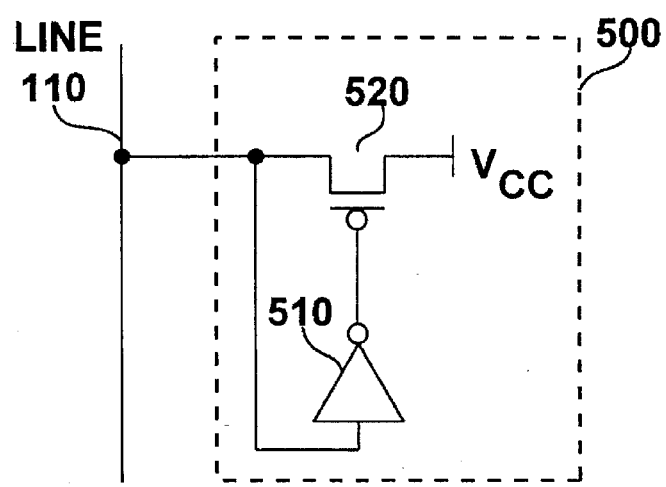
FIG. 5 shows an example retainer which can be used with an encoder according to one embodiment of the present invention.

It is to be appreciated that a wide variety of additional modifications can be made to the encoder 200 of FIG. 2 within the spirit and scope of the present invention. For example, an additional inverter 510 and transistor 520 can be coupled to the outputs of signal lines 110 as shown in FIG. 5. This additional circuitry 500 is referred to as a "retainer" or a "jamb latch", and allows the output to maintain its state if, for example, the clock signal were to be temporarily suspended. The clock signal could be suspended temporarily for a wide variety of reasons, such as a microprocessor using clock throttling to reduce power consumption.

In one embodiment of the present invention, the number of input signal lines 105 which can be coupled to a single output line 110 is limited. This limitation is a result of capacitive loads created by the transistors coupled to an output line 110. In one implementation, up to 32 input signals 105 can be coupled to a single output line 110.

Figure 6:
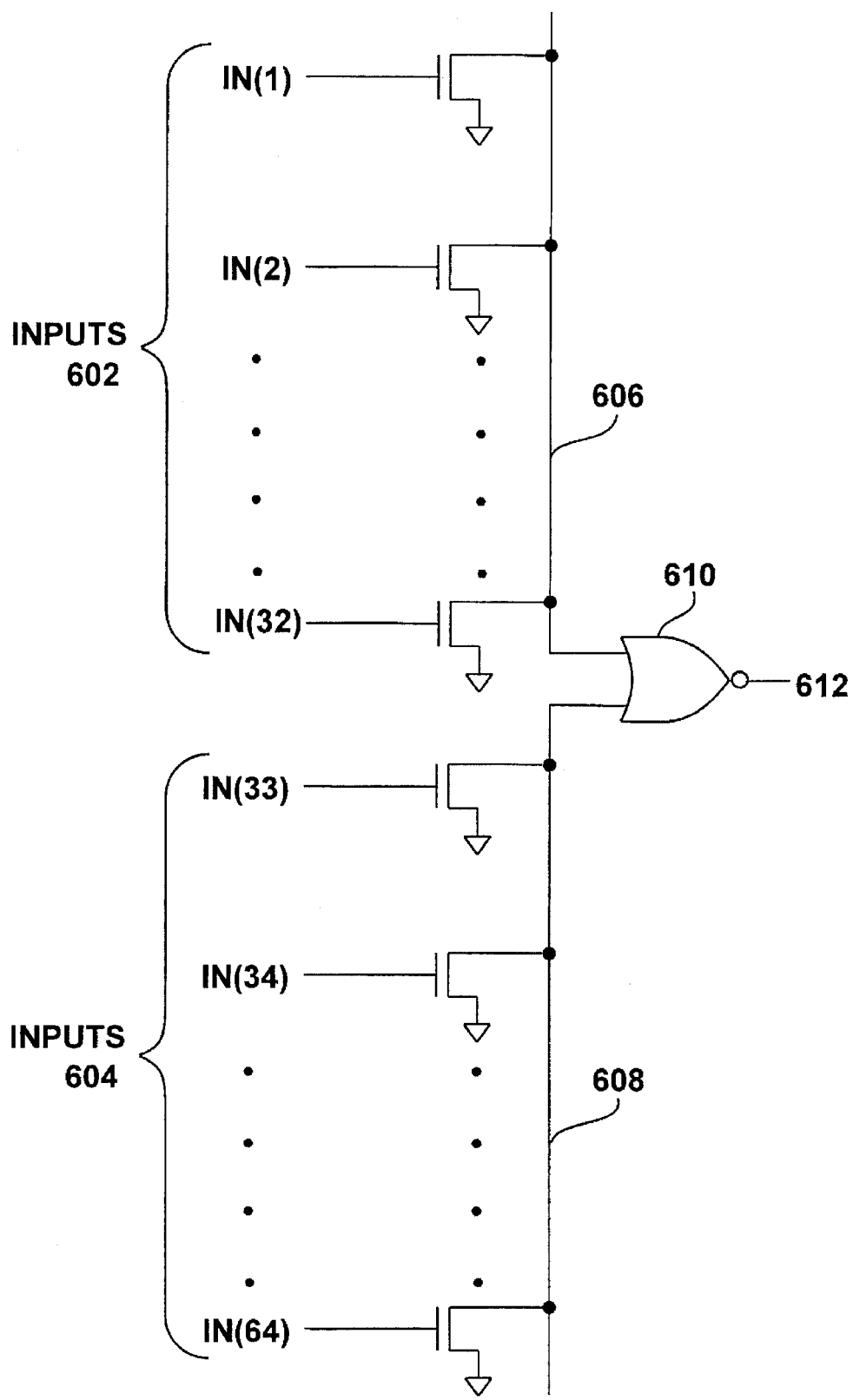
FIG. 6 shows a separation of multiple input signals for one output signal line according to one embodiment of the present invention.

In one embodiment, multiple input signals can be split onto two separate buses which are then logically combined to generate an output signal 110. FIG. 6 shows a separation of multiple input signals for one output signal line according to one embodiment of the present invention. As shown in FIG. 6, a total of 64 input signals are input to the encoder. The 64 input signals are separated into two different sets, input set 602 and input set 604. Each input set 602 and 604 is coupled to a bus 606 or 608 as shown, which includes 32 input signal lines. Both of the buses 606 and 608 are also coupled to the input of a logical NOR gate 610. The output of the logical NOR gate 610 is an output signal 612, which is one of the output signals 110 of the encoder.

The circuitry of FIG. 6 is for a single output line. It is to be appreciated by those skilled in the art that the circuitry of FIG. 6 is duplicated for each of six output lines, and a valid signal output line (if included), for a 64-to-6 encoder.

Figure 7:
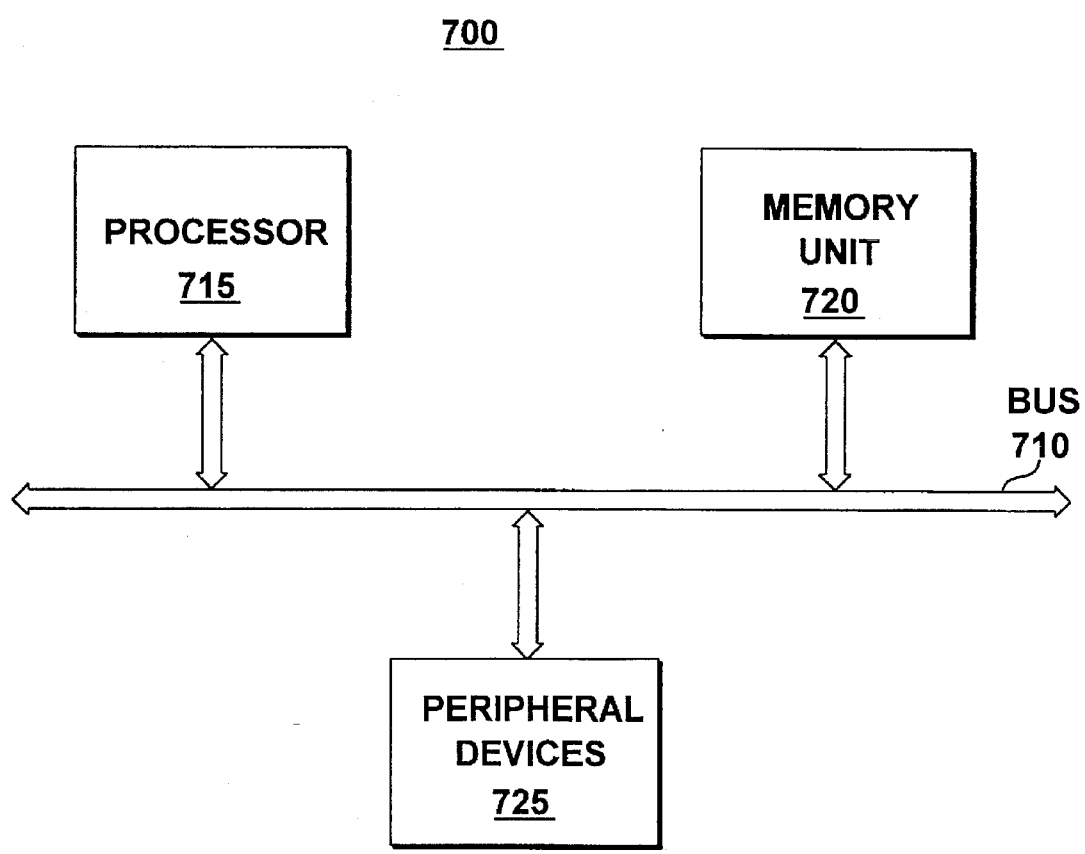
FIG. 7 shows a block diagram of a computer system such as may be used with one embodiment of the present invention.

FIG. 7 shows a block diagram of a computer system such as may be used with one embodiment of the present invention. A computer system 700 is shown comprising a bus or other communication device 710 for communicating information and a processor 715 for processing information and instructions. In one implementation, the processor 715 is an Intel® Architecture microprocessor; available from Intel Corporation of Santa Clara, Calif. However, the computer system 700 may utilize any type of microprocessor architecture; it is to be appreciated that the particular microprocessor architecture used is not especially germane to the present invention.

In one embodiment, bus 710 includes arbitration, address, data and control buses (not shown). The system also includes a memory unit 720 which may be a random access memory (RAM) and/or a read only memory (ROM) for storing information and instructions for the processor 715. Peripheral devices 725 are also coupled to bus 710 for inputting and outputting data and control information to and from the processor 715 and memory unit 720. Peripheral devices could include, for example, a mass storage device such as a magnetic or optical disk and disk drive, a display device, an alphanumeric input device including alphanumeric and function keys, and a cursor control device. A hard copy device such as a plotter or printer may also be included in peripheral devices 725.

It is to be appreciated that computer system 700 may include additional processors or other components. Furthermore, certain implementations may not require nor include all of the above components. For example, an alphanumeric input device or a cursor control device may not be included in peripheral devices 725.

The encoder circuit of the present invention can be used in many of the components of computer system 700. For example, an encoder circuit in accordance with the present invention can be used within processor 715 to encode memory block identifiers. By way of other examples, encoder circuits in accordance with the present invention can be used to encode signals in memory unit 720, or any one or more of the peripheral devices 725.

It is to be appreciated that although the discussions above describe the implementation of the present invention using CMOS technology, the present invention can be implemented in any of a wide variety of conventional processing technologies. These processing technologies include, for example, NMOS, BINMOS, etc.

Whereas many alterations and modifications of the present invention will be comprehended by a person skilled in the art after having read the foregoing description, it is to be understood that the particular embodiments shown and described by way of illustration are in no way intended to be considered limiting. References to details of particular embodiments are not intended to limit the scope of the claims.

Thus, a high-speed encoder circuit using dynamic logic has been described.

What is claimed is:

1. A high-speed block identifier encoder circuit comprising:
   a plurality of output signal lines for providing an encoded output identifying which one of a plurality of input signals from an array is asserted;
   a first portion coupled to the plurality of output signal lines for pre-charging the plurality of output signal lines to a first state; and
   a plurality of transistors coupled together in a single level for receiving the plurality of input signals and for discharging the plurality of output signal lines to a second state based on the plurality of input signals.

2. The encoder circuit of claim 1, wherein the first portion comprises:
   a plurality of transistors each having a first terminal coupled to one of the plurality of output signal lines, a second terminal coupled to a voltage source, and a gate terminal coupled to a clock signal.

3. A method for generating an encoded block id identifying which one of a plurality of signals input from an array is asserted, the method comprising the steps of:
   (a) receiving a clock signal;
   (b) pre-charging a plurality of output signal lines to a first state when the clock signal is in a second state;
   (c) receiving a first signal of the plurality of input signals after the clock signal transitions to a third state;
   (d) discharging a first set of the plurality of output signal lines to a fourth state in response to the first signal; and
   (e) providing the plurality of output signal lines as the encoded block id.

4. The method of claim 3, further comprising the steps of:
   (f) discharging a valid output signal line to the fourth state in response to the first signal; and
   (g) providing the valid output signal line in the fourth state as a valid signal indicating the encoded block id is valid on the plurality of output signal lines.

5. The method of claim 3, wherein each output signal line of the first set is coupled to a transistor of a set of transistors, wherein each transistor of the set of transistors has a gate terminal coupled to the first signal, and wherein the discharging step (d) comprises discharging the first set of lines through the set of transistors responsive to the first signal being asserted.

6. An apparatus for encoding onto a plurality of output signal lines which one of a plurality of signal lines input from an array is asserted, the apparatus comprising:
   a plurality of output signal lines for providing an encoded output identifying which one of the plurality of input signals is asserted;
   a clock signal input line coupled to the plurality of output signal lines through a first plurality of transistors for pre-charging the plurality of output signal lines to a first state;
   a second plurality of transistors coupled together in a first level, wherein a gate terminal of each of the second plurality of transistors is coupled to one of the plurality of input signal lines; and
   the second plurality of transistors for discharging the plurality of output signal lines to a second state responsive to the plurality of input signal lines.

7. The apparatus of claim 6, wherein each of the first plurality of transistors is a PMOS transistor and each of the second plurality of transistors is an NMOS transistor.

8. The apparatus of claim 6, wherein the first state corresponds to a logical one and the second state corresponds to a logical zero.

9. The apparatus of claim 6, wherein each of the second plurality of transistors is connected to only one of the plurality of input signal lines and only one of the plurality of output signal lines.

10. The apparatus of claim 9, further comprising each of the second plurality of transistors being coupled together in series with one of a third plurality of transistors, wherein a gate terminal of each of the third plurality of transistors is coupled to the clock signal input line.

11. The apparatus of claim 6, wherein the second plurality of transistors are arranged into a plurality of sets, wherein the gate terminal of each transistor of each set of the plurality of sets is coupled to one of the plurality of input signal lines, and wherein a first terminal of each transistor of a set of the plurality of sets is coupled to a different one of a subset of the plurality of output signal lines.

12. An apparatus for generating an encoded block id that identifies which one of a plurality of signals input from a memory array is asserted, the apparatus comprising:
   means for receiving a clock signal;
   means for pre-charging a plurality of output signal lines to a first state when the clock signal is in second first state;
   means for receiving a first signal of the plurality of input signals after the clock signal transitions to a third state;
   means for discharging a first set of the plurality of output signal lines to a fourth state in response to the first signal; and means for providing the plurality of output signal lines as the encoded block id.

13. The apparatus of claim 12, further comprising:

means for discharging a valid output signal line to the fourth state in response to the first signal; and means for providing the valid output signal line in the fourth state as a valid signal indicating the encoded block id is valid on the plurality of output signal lines.

14. The apparatus of claim 12, wherein each output signal line of the first set is coupled to a transistor of a set of transistors, wherein each transistor of the set of transistors has a gate terminal coupled to the first signal, and wherein the means for discharging comprises means for discharging the first set of lines through the set of transistors responsive to the first signal being asserted.

* * * * *